United States Patent [19]

Jones

[11] 4,370,406
[45] Jan. 25, 1983

[54] DEVELOPERS FOR PHOTOPOLYMER LITHOGRAPHIC PLATES

[75] Inventor: Thomas H. Jones, Naperville, Ill.

[73] Assignee: Richardson Graphics Company, Des Plaines, Ill.

[21] Appl. No.: 263,073

[22] Filed: May 12, 1981

Related U.S. Application Data

[63] Continuation-in-part of Ser. No. 107,452, Dec. 26, 1979, abandoned, which is a continuation of Ser. No. 900,276, Apr. 26, 1978, abandoned.

[51] Int. Cl.³ .......................... G03C 5/24; G03C 5/34; G03F 7/02; G03F 7/08
[52] U.S. Cl. .................................. 430/331; 430/149; 430/309
[58] Field of Search .................... 430/331, 309, 149

[56] References Cited

U.S. PATENT DOCUMENTS

| | | | |
|---|---|---|---|
| 3,475,171 | 10/1969 | Alles | 96/35.1 |
| 3,578,452 | 5/1971 | Parker | 96/49 |
| 3,607,271 | 9/1971 | Hillhorst et al. | 430/331 |
| 3,615,480 | 10/1971 | Lam | 430/331 |
| 3,619,217 | 11/1971 | West | 430/331 |
| 3,701,657 | 10/1972 | Moore et al. | 430/331 |
| 3,707,373 | 12/1972 | Martinson et al. | 430/309 |
| 3,791,828 | 2/1974 | Moore et al. | 96/33 |
| 3,891,438 | 6/1975 | Katz et al. | 96/49 |
| 3,891,439 | 6/1975 | Katz et al. | 96/49 |
| 3,905,815 | 9/1975 | Bonham | 96/75 |
| 3,909,269 | 9/1975 | Parker et al. | 96/35.1 |
| 3,929,489 | 12/1975 | Arcesi et al. | 96/35.1 |
| 4,055,515 | 10/1977 | Kirch | 96/35.1 |
| 4,120,425 | 12/1978 | Boyd | 430/331 |
| 4,186,006 | 1/1980 | Kobayashi et al. | 430/309 |
| 4,271,261 | 6/1981 | Shimizu et al. | 430/309 |

FOREIGN PATENT DOCUMENTS

| | | | |
|---|---|---|---|
| 1272868 | 5/1972 | United Kingdom | 430/331 |
| 1408709 | 10/1975 | United Kingdom | 430/331 |

OTHER PUBLICATIONS

DeForest, W. S., "Photoresist", McGraw-Hill Book Co., 1975, pp. 199-200.

*Primary Examiner*—Charles L. Bowers, Jr.
*Attorney, Agent, or Firm*—Lockwood, Dewey, Alex & Cummings

[57] ABSTRACT

A single-phase, non-emulsion water containing subtractive developer for lithographic plates having photopolymer coatings is provided. These developers include water and an active or primary solvent which is only partially soluble in water and which is a good solvent for the photopolymer of a lithographic plate that has not been exposed to and insolubilized by actinic radiation, this active solvent typically being present at a concentration near its water solubility limit. Preferably, a cosolvent is also included to increase the water solubility of the active solvent when necessary. A desensitizer may be included to impart to the formulation the properties of a one-step developer or of a finisher. Formulation and development methods for these developers are also included, and they may be used either as developers or as a machine developer solution replenisher.

14 Claims, No Drawings

DEVELOPERS FOR PHOTOPOLYMER LITHOGRAPHIC PLATES

This is a continuation-in-part of application Ser. No. 107,452, filed Dec. 26, 1979, now abandoned, which is a continuation of application Ser. No. 900,276, filed Apr. 26, 1978, now abandoned.

BACKGROUND AND DESCRIPTION OF THE INVENTION

This invention generally relates to developers for lithographic plates, especially subtractive developers that are of the single-phase, non-emulsion water-containing type. More particularly, the present invention is directed to an improved developer composition and method of preparing and using it, the composition including a water miscible cosolvent in admixture with an active solvent that is only partially soluble in water but that is a good solvent for the unexposed photopolymer of the plate being developed, the active solvent preferably being present at a concentration near its water solubility limit. In another important aspect of this invention, the composition includes a hydrophilic synthetic resin desensitizer at low concentrations in order to render the composition a so-called one-step developer that is a finisher as well as a developer.

Developers for photosensitive lithographic plates can be said to fall into two general classes, emulsion developers and non-emulsion developers. Emulsion developers are often additive developers in that they add coloring to the image and usually include a reinforcing resin to coat and strengthen the plate image area. Subtractive type emulsion developers are also known, such as S85CKK (Richardson Graphics), this being a colorless emulsion developer which takes away non-image coloration in developing a photopolymerizable plate. Other emulsion developers are mentioned in Hall U.S. Pat. No. 2,754,279. Entirely organic or primarily all organic developers are shown in Martinson et al., U.S. Pat. No. 3,707,373. Parker et al U.S. Pat. No. 3,909,269 mentions that ethylene glycol monoethyl ether acetate (2-ethoxyethyl acetate) may be employed by itself or in emulsion form as a developer for the photopolymers of that patent.

Emulsion developers typically include water at varying percentages. Being an emulsified composition of organic compounds, emulsion developers tend to separate on storage and typically exhibit high viscosity levels making them unsuitable for use in lithographic plate processing machines, meaning that such developers will require hand working of the plate. Also, subtractive emulsion developers have some tendency to redeposit polymer removed from non-image areas onto image areas, resulting in unsightly specks on the developed plate, often leading to the rejection of that plate by the plate maker. Emulsion or all-organic developers, because of their high concentrations of organic solvents, are generally expensive, possess unpleasant odors, and generate serious disposal problems.

It is accordingly desireable to provide a developer which is not an emulsion and whoch does not have large concentrations of organic solvents. Examples of developers or processing solutions which do not have large concentrations of organic solvents can be found in Larson U.S. Pat. No. 3,136,637 and Bonham U.S. Pat. No. 3,905,815, which show developer systems that are aqueous systems which include water miscible solvents. Synthetic resin desensitizers useful in compositions for lithographic platemaking and discussed in Lawson U.S. Pat. No. 4,033,919, the disclosure thereof being herein incorporated by reference.

While aqueous systems having water miscible solvents and low concentrations of organic solvents generally avoid many of the problems associated with emulsion developers or developers that are primarily or entirely organic solvents, these types of aqueous systems have certain drawbacks which limit their ability to be used within machine or automatic type developers. Since these developers are typically simple, single phase highly miscible solutions that supply only one-dimensional solvent properties for the overall lithographic plate system, they tend to directly solubilize the non-image area lithographic plate layers, making the removed polymer susceptible of being redeposited on the image areas by the mechanical operation of a developing machine which could otherwise be avoided by the skilled hand of an experienced operator. Additionally, these types of developers can occasionally lead to problems because the one-dimensionally acting solvent may tend to attack the image areas on the plate if allowed to soak thereon for excessive periods of time.

Accordingly, there has been brought about a need for a two-dimensional type of developer which can selectively remove only the non-image areas of an exposed photopolymer plate without having the non-image areas dissolved within an entire single-phase solvent that can lead to redeposition of the removed polymer onto a plate by the mechanical, unthinking action of an automatic machine developing apparatus. Also needed is a developer that will not attack image areas on a plate, even if allowed to stand undisturbed on a plate being developed for excessive lengths of time.

By the present invention, it is now possible to have a non-emulsion, aqueous-type developer that exhibits improved selectivity properties which cause the unexposed photopolymer layer to be swollen and lifted off of the plate by an active solvent that will be absorbed out of the homogeneous solution by its affinity for the unexposed photopolymer but not the exposed photopolymer, which swollen photopolymer can then be removed by mechanical action, either by hand or as provided by machine developers, with the water remaining within the developer removing an unhardened diazo layer or similar type of resin layer that may be underneath the photopolymer.

These results are accomplished primarily by formulating a non-emulsion, single-phase aqueous solution to include an active solvent which is a good solvent for the unexposed photopolymer of the particular plate being treated but is only partially soluble in water, the active solvent preferably being present within the formulation at a concentration near its solubility limit in the aqueous system. The active solvent in such a developer has an affinity for the unexposed photopolymer on the plate that is greater than its tendency to remain within the single-phase aqueous developer solution, resulting in the general migration of the active solvent out of the non-emulsion developer to thereby form in situ a type of two-dimensional developer, with the amount of solvent needed to solublize the unexposed photopolymer being drawn out of the aqueous developer in order to dissolve the unexposed photopolymer, which dissolved photopolymer and active solvent can be readily and mechanically removed without redeposition or attack on exposed image areas, these results being brought about with a developer that has a substantial water content and with the advantages attendent to an aqueous developer solution.

It is, therefore, a general object of the present invention to provide an improved developer for lithographic plates which include photopolymer coatings.

Another object of the present invention is to provide a single-phase, clear developer for photopolymer lithographic plates suitable for use either in lithographic plate processing machines or by hand.

Another object of this invention is to provide a developer in which the majority constituent is water so that the cost, odors, and disposal problems associated with organic solvents can be reduced.

Another object of the present invention is to provide an improved developer which, when used, eliminates or all but eliminates redeposition of removed non-image polymer back onto the plate, particularly the image areas thereof.

Another object of this invention is an improved developer that will desensitize, or render more hydrophilic, the non-image areas of lithographic photopolymer plates after removal of polymer therefrom in order to increase the ink-repellency of such areas during subsequent printing operations.

Another object of the present invention is to provide an improved developer which, after it is used, need not be rinsed off of the developed plate.

Another object of the present invention is the provision of an improved developer which will also perform the function of a finisher in order to gum or finish photopolymer lithographic plates after development to the extent that the developer is a one-step developer requiring no additional gumming or other treatment in order to form a clean running plate during printing, whether the plate is used immediately or is stored indefinitely before printing use.

Another object of this invention is to provide an improved developer formulation that is initially a single-phase developer having an active solvent which is selectively absorbed out of the single phase due to its affinity for the unexposed photopolymer being greater than its tendency to remain within the aqueous system.

These and other objects of this invention will be apparent from the following further detailed description thereof.

In its basic embodiment, the lithographic plate developer in accordance with this invention is a single-phase, non-emulsion water-containing subtractive developer having an active solvent which is a good solvent for the photopolymer of the particular plate being developed and which is only partially soluble in the developer system. Preferably, the active solvent is present within that system at a concentration near its solubility limit therewithin. It is preferred that the active solvent be in solution in the presence of an organic cosolvent, operating as an extender or diluent, when it is necessary to render the system clear and homogeneous and in order to temper somewhat the photopolymer solubilizing activity of the active solvent. Also preferably included within the single-phase solution is a hydrophilic surfactant to improve the ability of the solution to prevent redeposition of removed polymer onto the plate. When a single-step developer is desired or when the developer is to be used as a finisher, a hydrophilic synthetic resin desensitizer is included, preferably in combination with an acidity enhancing agent. In any possible formulation, the balance thereof will be water to make up an aqueous solution, which may include up to 90 weight percent or more water.

Essential to this invention is an active or primary solvent which is a good solvent for a lithographic plate photopolymer and which is partially water insoluble or only partially soluble within the total aqueous system of the developer. Such active solvents will have an affinity for the unexposed photopolymer at the non-image areas of a lithographic plate which is greater than its tendency to remain at equilibrium within the aqueous developer solution, especially when the active solvent is at a concentration near its water solubility limit. An acceptable active solvent will be one having a boiling point of greater than 100° C. to make it less volatile than water or azeotropes at less than 100° C.; it should also have an odor level and a toxicity low enough to render the developer acceptable for use in unvented locations and the active solvent should be relatively inexpensive. Typical acceptable active solvents will have a moderate molecular weight. Preferred active solvents include those having ethylene glycol groups to impart water solubility properties thereto, together with acetate groups to provide the solvent with partial insolubility attributes.

Active or primary solvents may be glycol diacetates, glycol diethers and glycol ether acetates; keto-ethers; and miscellaneous solvents having the requisite properties.

Examples of glycol diacetates, glycol diethers and glycol ether acetates include 2-ethoxyethyl acetate or ethylene glycol monoethyl ether acetate; 2-methoxyethyl acetate; 2-(2-ethoxyethoxy) ethyl acetate; triethylene glycol diacetate; ethylene glycol diacetate; diethylene glycol diethyl ether; dibutylene glycol diethyl ether; diethylene glycol dimethyl ether; dibutylene glycol diethyl ether; triethylene glycol dimethyl ether, and ethylene glycol monobutyl ether acetate. Examples of keto-ethers include 4-methoxy-4-methyl-pentanone-2. Examples of miscellaneous solvents include ethyl lactate (ethyl α-hydroxy propionate) and 2-methyl-2-ethyl-1,3-dioxolane.

Most preferred as the active solvent is 2-ethoxyethyl acetate because it is particularly inexpensive, has low volatility and toxicity, and has only a mild odor. It also has especially acceptable partial water solubility properties, having a solubility in water of about 23.8 weight percent, meaning that, while it does exhibit limited water solubility, it is partially water insoluble and clearly not miscible with water. In general, the active or primary solvent can be present within the developer or machine developer solution replenisher at a concentration below its water solubility limit, usually at a percentage no more than 10 weight percentage points less than or more than its water solubility limit, preferably no more than 7 weight percentage points less than or greater than its water solubility limit. The active solvent usually will make up between about 4 to about 50 weight percent of the developer or replenisher, preferably between about 5 and 35 weight percent, and most preferably between about 10 to about 30 weight percent of the developer, based on total developer weight. It is to be appreciated that, since the concentration of the active solvent is generally keyed to its water solubility limit, these concentration ranges can vary depending upon the particular active solvent chosen.

When, as is preferred, a cosolvent is included in the single-phase, non-emulsion aqueous solution developer as an extender or diluent of the active solvent, such cosolvent must be compatible with the chosen active solvent primarily for the purpose of avoiding a phase separation of the active solvent from the water within the formulation whereby effective levels of active solvent may be included within the single-phase aqueous solution. The active solvent, the cosolvent and the water of these developers will, once they reach equilibrium, form a clear single phase that exhibits no light scattering. Through the use of a cosolvent, the active solvent will be able to be included at a concentration that is even above if not actually substantially equal to its water solubility limit without experiencing undesirable phase separation when the developer is stored for lengthy periods of time. These cosolvents will be more miscible with water than will the active solvent with which each cosolvent is combined in any one formulation.

Typical cosolvents will be alcohols, glycols, glycol ethers, ketones, acetates and cyclic esters. Representative cosolvents include diacetone alcohol (4-hydroxy-4-methyl-pentanone-2); 2-(2-ethoxyethoxy) ethanol; 2-(2-methoxyethoxy) ethanol; 2-ethoxyethanol; 2-methoxyethanol; 2-butoxyethanol; glycerol; ethylene glycol; proplylene glycol; diethylene glycol; triethylene glycol; tetraethylene glycol; a polyethylene glycol; methyl alcohol; ehtyl alcohol; n-propyl alcohol; isopropyl alcohol; acetone; methyl ethyl ketone; acetyl acetone; ethyl acetate; and lactones especially butyrolactone.

Examples of preferred solvents include diacetone alcohol and 2-ethoxyethanol, since each may be used in relatively low concentrations while still rendering the single-phase solution developer clear and homogeneous. Also to be considered in selecting one of these various cosolvents are the relative costs thereof. Cosolvents of high volatiltiy and toxicity are less desirable. Concentration levels for the cosolvent within the total single-phase, non-emulsion aqueous solution developer can range between zero and about 80 weight percent, preferably between about 2 and about 70 weight percent, and most preferably within a range of between about 5 to about 50 weight percent. These concentration ranges will be variable depending upon the particular combination of active solvent and cosolvent, and is especially dependent upon the limit of water solubility for the active solvent being cosolubilized or extended.

Especially advantageous results obtain when the single-phase aqueous developer solution further includes a surfactant, which will all but eliminate any possible redeposition problems. Surfactants that are especially hydrophilic will be particularly useful in avoiding image area solubilization and excessive softening of the removed photopolymer. Surfactants will function to assist in making the developer formulation a clear one, to aid in wetting the photopolymer surface as the developer solution is applied, and to operate as a wetting agent for the removed polymer in order to prevent redeposition. The surfactant is also believed to help control the amount of total solvent absorption by the photopolymer which can lead to an overly soft condition resulting in redeposition on image areas. Concerning its wetting function, the surfactant will cause the homogeneous developer solution to surround photopolymer globules as they are removed, rather than surrounding them with active solvent which could make them generally tacky and inclined to adhere to image areas.

Excessive surfactant concentrations render the developer solution too foamy, may result in some image loss, and/or may reduce developer activity. Surfactant concentrations, based on the total weight of the developer solution, can range from zero to about 5 weight percent, preferably from about 0.01 to about 2 weight percent and most preferably between about 0.05 and about 1.0 weight percent.

Surfactants useful in this formulation should be hydrophilic. They may be either nonionic, cationic, anionic, or amphoteric, the nonionic surfactants being generally preferred. Any one of a number of known surfactants can be incorporated such as those including ethylene oxide groups as their hydrophilic constituent. Representative of this type are an ethoxylated long chain tridecyl alcohol composition of medium viscosity (about 116 cps) having a molecular weight of 770; and certain block copolymers of propylene oxide and ethylene oxide terminated at both ends with polyethylene oxide groups having a $\alpha$-hydro-omega-hydroxy-poly(oxyethylene)poly(oxypropylene)poly(oxyethylene) block copolymer structure as described in U.S. Pat. No. 2,674,619. Acceptable examples of this latter group of block copolymers are those having 40% of polyoxyethylene hydrophilic units in the total molecule, the poly(oxypropylene) hydrophobe having a typical molecular weight of about 1750 and those having 50% polyoxyethylene units in the molecule, the hydrophobe having a typical molecular weight of about 3250, the latter polymer being especially preferred because it can be used at a very low level while still being effective in bringing about the results desired by the surfactant when it is included within the aqueous solution developers.

In proceeding with another aspect of this invention, the single-phase, non-emulsion aqueous solution developer may be modified into a one-step developer, which modification also makes it suitable for use as a finisher as well as a developer. The modification is accomplished by including a desensitizer which is a hydrophilic synthetic resin.

An acceptable desensitizer will render more hydrophilic the non-image areas of lithographic plates after the photopolymer has been removed therefrom so that these areas will be ink-repellant during printing. They will assist in avoiding scumming or toning of these non-image areas during printing, which can often occur even after lithographic plates have been developed and gummed. Also, the inclusion of a desensitizer in accordance with this aspect of the invention will result in the improved development of plates that have been stored for several months prior to exposure and development.

In addition to being hydrophilic, the desensitizer should be soluble in and compatible with the rest of the aqueous system of the developer. The desensitizer may be a sulfite, a phosphate, or combinations thereof, or the desensitizer may be a synthetic resin that is hydrolyzed or alcoholized to a significant and substantial level, which resins also function as chelating agents. Resins that have been hydrolyzed to particularly high levels are most suitable. Hydrophilic synthetic resin desensitizers inlcude styrene-maleic anhydride copolymers which have been hydrolyzed or alcoholized, vinyl ether-maleic anhydride copolymers which have been hydrolyzed, and modified polyacrylamides having a molecular weight of about 200,000 and a minority carboxyl content. Preferred is a hydrophilic synthetic resin that is a polyacrylamide having a molecular weight of approximately 200,000 in which approximately 70 percent of the acrylamide groups thereof have been hydrolyzed to acrylic acid groups and that can be thought of as a 70/30 copolymer of sodium acrylate and acrylamide which is predominately in salt form and therefore alkaline.

Amounts of this desensitizer typically incorporated within these developer formulations can be as high as about 5 percent by weight based upon the total weight of the developer formulation, this upper limit being variable depending upon the specific desensitizer and being determined generally by the viscosity increases brought about by an inclusion of these resins into the solution. The extent of solubility within the aqueous formulation is also a limiting factor on the amount of desensitizer that can be included. A typical preferred range will be between about 0.5 and about 2 weight percent. An especially preferred range for the preferred polyacrylamide resin is between about 0.5 and about 1.5 weight percent.

Since a desensitizer will generally be predominately in salt form before inclusion within the formulation in accordance with this invention, best desensitization properties will be achieved by rendering the developer somewhat acidic, which will increase the solubility of the desensitizer within the single-phase, non-emulsion aqueous solution developer. It is accordingly preferred to include an acidity agent in the formulations which include desensitizers that are provided in alkaline form. Typical acidity agents will be weak mineral acids and acidic salts thereof, as well as organic acids and acidic salts thereof, added in concentrations that will generally lower the pH of the developer or finisher to between about 4.5 and 5.5, such acidity agent often acting in cooperation with the desensitizer for buffering the developer composition. Examples include lactic acid, phosphoric acid, ammonium dihydrogen phosphate, citric acid and its acidic salts, acetic acid, tartaric acid, and the like, the preferred agent being lactic acid. Such an acidity agent can be included in amounts from zero to about 5 weight percent based upon the total weight of the developer solution, preferably between about 0.5 to about 2 weight percent.

Miscellaneous materials may further be included within the single-phase, non-emulsion water-containing developers in accordance with this invention provided they do not significantly alter the overall properties of the composition. These include defoamers or antifoamers, synthetic resin viscosity increasing agents such as hydroxypropyl cellulose, conventional colorants, conventional corrosion inhibitors, chelating agents such as the polyacrylamide resin desensitizers, humectants such as glycerine, antioxidants such as glycerine, odor maskers, and buffers. If needed to insure ready acceptance of ink by the image areas of the developed photopolymer plate, hydrophobic defoaming materials compatible with the aqueous solution could be added up to about 0.1 weight percent of the composition, such as Carboset resins or α-hydro-omega-hydroxy-poly-(oxyethylene) poly(oxypropylene)-poly(oxyethylene)block copolymer hydrophobic surfactants having only about 10% polyoxyethylene groups in the total molecule and polyoxypropylene hydrophobes of molecular weights from about 900 to 1800.

Developers made in accordance with this invention will be of the subtractive type, meaning that they take away non-exposed or non-crosslinked photopolymers, which makes them particularly suitable for use in conjunction with subtractive developable negative-working plates. The invention is capable of developing negative working plates which are normally developed by an additive type of developer.

As a general proposition, developers in accordance with this invention will develop lithographic plates that are susceptible to a typical photo-insolubilization process. They are particularly well suited for developing photopolymer lithographic plates known as 3-R plates, S-85 plates, and S-56 plates (Richardson Graphics), which are brush grained, anodized and subbased aluminum plates coated with a thin layer (2-10 mg./sq. ft). of diazo material which is then overcoated with a moderate layer (20-120 mg./sq. ft.) of cinnamate photopolymer, such as generally described in U.S. Pat. No. 3,808,004. Numerous other plates can be adequately developed according to this invention; the principle requirement is that they include a polymer that is swellable by the active solvent. When used as a hand developer, this invention will be suitable for developing almost any presently known photopolymer lithographic plate. When machine development is to be practiced, the developer is particularly suitable for plates having cinnamate photopolymer layers.

In proceeding with the method in accordance with this invention, the active solvent is dissolved in water to near its water solubility limit, preferably with the assistance of the cosolvent extender or diluent in the proportions specified herein. Small amounts of surfactant may also be included to improve the general wetability of the developer formulation prepared. Other optional ingredients may be put into solution, such as defoamers, antifoamers, viscosity increasing agents, colorants, corrosion inhibitors, chelating agents, humectants, antioxidants, buffers, and hydrophobic materials. By another aspect of this method, the hydrophilic synthetic resin desensitizers are added, with stirring, up to about 5 weight percent in order to provide a formulation that is both a one-step developer and a formulation suitable for finishing as well as developing. When the desensitizer put into solution is alkaline, best desensitization properties are usually realized by dissolving an acidity agent into the formulation.

After these solution forming steps are completed, the resulting formulation is a single-phase, non-emulsion subtractive developer for lithographic plates having a swellable photopolymer layer. During development, the method is believed to proceed by the following steps.

When the developer is applied to an exposed lithographic plate, either by hand with a developer-saturated developing pad or by machine with the brushes or the like of automatic plate processors which recirculate developer after filtering out removed polymer particles, the developer will be allowed to presoak into the plate for a total period of time between about 10 seconds to about 60 seconds, depending upon the temperature, the size of the lithographic plate, and/or the capabilities of the processing machine. During this presoaking period, the active solvent, which may be accompanied by some of the cosolvent, is absorbed out of the homogeneous single-phase developing solution and into the photopolymer due to its affinity for the swellable photopolymer layer being greater than its tendency to remain in solution at or near its water solubility limit. This absorbing step results in a swelling of the photopolymer which is followed by mechanically removing the swollen polymer, either by hand rubbing or automatically within a processing machine. When the plate being developed includes a diazo resin layer or other water soluble layer, the water within the formulation will solubilize this underlying, unhardened layer for removing it from the plate in the non-image areas.

During these developing steps, each of the other components dissolved within the formulation function in accordance with their intended purpose when included within the formulation. Generally, if the developer formulation contains too much active solvent or too little cosolvent when included, the developer formulation will be too active and will tend to attack the image areas of the plate. But if the formulation contains too little active solvent and/or too much cosolvent, the unexposed photopolymer will not be completely removed from the non-image areas of the photolithographic plate.

For formulations that do not include the hydrophilic desensitizer, the developed plate will then typically be subjected to secondary development steps common to a two-step process, including rinsing the plate thoroughly with tap water to remove polymer globules and remaining developer from the plate surface, usually in conjunction with gently rubbing the plate with a wet sponge or the like, after which the plate may then be sqeegeed or buffed dry with absorbent material such as paper tissue, followed by gumming with any conventional litho gum or gum asphaltum etch. When a desensitizer is included, the same secondary development steps can be proceeded with, or they can be omitted in order to accomplish a one-step developing procedure by merely wiping off the excess developer and by omitting the subsequent water rinsing and gumming steps. Alternatively, the developing formulation can be used also as a finisher, in which case the water rinsing and gumming can also be omitted, although the water rinsing step can be proceeded with if desired; thereafter, the developing formulation is applied as a finisher with a plain pad, absorbent tissue, or the like, followed by buffing the plate dry with absorbent tissue.

The following specific examples will more precisely illustrate the invention and teach the procedures presently preferred for practicing the same, as well as the improvements and advantages realized thereby.

EXAMPLE I

Various formulations were made including from 20 through 50 weight percent of 4-methoxy-4-methyl-pentanone-2 as the active solvent, together with from 10 through 20 weight percent of diacetone alcohol as the cosolvent, the balance being water. These compositions were found to be useful and tested well in their ability to develop S-85 photopolymerizable lithographic plates at moderately fast speeds. The developer was a single-phase, non-emulsion aqueous solution subtractive developer.

EXAMPLE II

Basis 100 parts by weight, a satisfactory developer formulation especially suitable for use in machine developers over extensive time periods is prepared to include 28 percent water, 6 percent ethylene glycol monobutyl ether acetate, 48 percent butyrolactone cosolvent, 17 percent of glycerine as a humectant and water substitute, and about 1 percent of a surfactant blend.

EXAMPLE III

A developer was prepared to include 27 weight percent water, 6 percent ethylene glycol monobutyl ether acetate, 48 percent butyrolactone, 1 percent of a desensitizer that is a blend of sodium sulfite and potassium dihydrogen phosphate, 1 percent of a buffer added in conjunction with the desensitizer, 17 percent of glycerine as a water substitute, humectant and stabilizer for the sulfite desensitizer, and 1 percent of a blend of surfactants. This composition exhibited excellent resistance to evaporation when used in a machine developer for simultaneously developing and desensitizing photopolymer lithographic plates.

EXAMPLE IV

On a 100 parts by weight basis, 23 weight percent 2-ethoxyethyl acetate, 10 weight percent 2-ethoxyethanol, and 0.1 weight percent propylene oxide and ethylene oxide block copolymer surfactant having polyethylene oxide groups at both ends, having about 50% polyoxyethylene units in the total molecule, and having the polyoxypropylene hydrophobic units at a molecular weight of about 3250, were dissolved within 66.9 weight percent water to form a single-phase, non-emulsion aqueous solution subtractive developer which was suitable for either hand development or machine development of a cinnamate overcoated subtractive lithographic plate.

In proceeding with the hand development, an exposed subtractive plate was placed on a developing table, and a short nap pad held flat in a pad clamp was saturated with this developer, followed by application to the entire plate without exerting any substantial pressure on the plate until the entire plate was covered with developer. The developer was allowed to soak into the plate surface for about 10 seconds, after which a resaturated developing pad was rubbed over the plate with moderate pressure to remove the coatings in the unexposed areas of the plate by using long, straight strokes along the length and the width of the plate. Development was continued until all the polymer was removed from the non-image areas, the smaller plates taking a total of about 45 seconds to develop and larger plates about 90 to 120 seconds at 70° F. The thus developed plate was then rinsed thoroughly with tap water to remove the remaining developer and polymer globules from the surface, the rinsing being accompanied by gentle rubbing with a wet sponge. This was followed by drying the plate with absorbent paper tissue, and then by gumming with a conventional lithographic gum asphaltum etch to make it ready for storage or use on a lithographic printing press.

Another amount of this developer was tested within a 440 Processor automatic developing machine of the rotary brush drum type by feeding the exposed plate into the entrance slot while the feed foot switch was activated. The plate which emerged from the exit slot was then rinsed, dryed and gummed using the same techniques as described in the hand development operation. A total of forty S-85 plates, each having an area of five square feet, were processed without changing the developer or filter bag before the quantity of developer fed into the machine (12 kilograms) was no longer able to completely develop these plates.

Another 12 kilograms of this developer was added to a 440 Processor and was used for successfully developing an Eastman Kodak LN-L photopolymer lithographic plate which does not contain a diazo layer but which does contain a photopolymer that was found to be swellable by the developing solution.

EXAMPLE V

Another Eastman Kodak LN-L photopolymer lithographic plate was successfully developed by hand with a solution that contained two cosolvents, the formulation being 23 weight percent 2-ethoxyethyl acetate, 8 weight percent 2-ethoxyethanol, 5 weight percent ethylene glycol, 0.3 weight percent of the surfactant of Example IV, and the balance water.

EXAMPLE VI

Several one-step developers and finishers were prepared that each contained, on a 100 percent by weight basis, 25 percent 2-ethoxyethyl acetate, 14 percent 2-ethoxyethanol, and 0.1 percent of the surfactant used in Example IV. Single-phase, non-emulsion aqueous solution subtractive developers were prepared by dissolving these three compositions with the preferred hydrolyzed polyacrylamide desensitizer, lactic acid, and water at the various weight percentage formulations A through G, as indicated in the following Table 1:

TABLE 1

|  | A | B | C | D | E | F | G |
|---|---|---|---|---|---|---|---|
| Desensitizer (weight %) | 0.5 | 1.9 | 0.75 | 1.0 | 1.0 | 1.5 | 2.0 |
| Lactic Acid (weight %) | 0 | 0 | 0.25 | 0.50 | 0.75 | 1.0 | 1.5 |
| Water (weight %) | 60.4 | 59.0 | 59.9 | 59.4 | 59.15 | 58.4 | 57.4 |

The 3-R cinnamate photopolymer lithographic plates were treated with these formulations both by hand and in a 440 Processor. Three different developing procedures were used after the initial development steps were completed either by hand or when they exited from the machine. A two-step development was accomplished in substantially the same manner as specified in Example IV for plates after the first steps of hand development and for machine developed plates. Also, a one-step development was practiced with substantially the same procedures of the two-step except that the latter steps of subsequent water rinsing and gumming were omitted; instead, the excess developer was merely wiped off. In another alternative procedure, the rinsing and gumming steps were again omitted, and the plate was merely wiped to remove excess developer and polymer, after which the developer formulation was reapplied with a clean pad and buffed dry with absorbent tissue, by which procedure the formulation was used as both a developer and a finisher.

Generally, each formulation resulted in acceptable plate development, as evaluated in humid-oven aging studies by which the developed plates were cut into sections, one set of the sections being tested by running a short press test, another set or more plates being stored for several days in a humid oven at 120° F. and 70 percent relative humidity and then press tested. Each of the formulations A through G desensitized satisfactorily. Formulations B and G tended to be somewhat more viscuous than would be desirable for a developer. Formulations A and B did not sensitize quite as satisfactorily as did the other formulations, apparently due to the absence of lactic acid, resulting in the desensitizer remaining somewhat alkaline. Composition C, having a low lactic acid content, had desensitizing properties that were not quite as satisfactory as formulations D, E and F.

EXAMPLE VII

Dissolving 2-ethoxyethyl acetate at 20 weight percent concentrations with various cosolvents, as differing concentrations, balance water, provided developers that were tested for development speed on S-85 plates. Using 2-(2-ethoxyethoxy) ethanol as the cosolvent component at 4 weight percent resulted in fast development; 5 weight percent diacetone alcohol gave very fast development; 3 weight percent 2-(2-methoxyethoxy)-ethanol gave very fast development; and 11 weight percent 2-butoxyethanol resulted in very slow plate development.

EXAMPLE VIII

A developer formulation of 25 weight percent 2-ethoxyethyl acetate, 10 weight percent diacetone alcohol and 65 weight percent water developed on S-85 plate with satisfactory speed and resulted in good image quality.

EXAMPLE IX

Following exposure of Enco's N200 and of 3M's photopolymer plates to a pulsed xenon light source for 60 seconds, and 50 seconds respectively, the plate was satisfactorily hand developed with a developer of 26 weight percent 2-ethoxyethyl acetate, 14 weight percent 2-ethoxyethanol, 0.1 weight percent of the surfactant of Example IV, 1.0 weight percent of the desensitizer of Example VI, 0.75 weight percent lactic acid, 0.004 weight percent of a hydrophobic defoamer, balance water at about 58.15 weight percent, the image quality being good. The hydrophobic defoamer was a block copolymer of propylene oxide and ethylene oxide of the type discussed herein, having 10 weight percent polyoxyethylene units and a molecular weight of about 4000 for the polyoxypropylene hydrophobe.

EXAMPLE X

Machine processor replenisher solutions were tested within an automatic plate processor having a 5 gallon developer capacity. The automatic processor was filled initially with a developer solution including 26 weight percent 2-ethoxyethyl acetate, 14 weight percent 2-ethoxyethanol, and 0.004 weight percent of the defoamer in Example IX. Rather than periodically removing the used developer and replacing it with a fresh 5-gallon batch, the initial developer fill was replenished periodically by adding enough of a developer solution replenisher formulation to bring the total developer solution up to full volume capacity of the machine. The particular replenisher formulation used included 28 weight percent 2-ethoxyethyl acetate, 11.5 weight percent 2-ethoxyethanol, and 0.1 weight percent of the surfactant used in Example IV.

Table 2 reports the number of plates and the cumulative plate square footage run through the machine processor before replenisher was added, the volume of replenisher solution added each time, and a partial analysis of the overall developer solution formulation within the machine processor after each replenisher addition. Analyses shown in Table 2 are for 2-ethoxyethyl acetate (% EEAc) and for 2-ethoxyethanol (% EE), which illustrate that the solvent concentrations were successfully maintained at very constant levels throughout the test period.

TABLE 2

| NO. OF PLATES | CUMULATIVE SQ. FT. | REPLENISHER ADDITION (ml.) | SOLVENT ANALYSIS % EEAc | SOLVENT ANALYSIS % EE |
|---|---|---|---|---|
| 0 | 0 | 0 | 26.0 | 14.00 |
| 20 | 110 | 0 | 24.8 | 13.8 |
| 25 | 128 | 1164 | 24.8 | 13.8 |
| 117 | 604 | 1027 | 25.0 | 14.0 |
| 117 | 604 | 327 | — | — |
| 166 | 893 | 863 | — | — |
| 227 | 1251 | 0 | 24.8 | 14.3 |
| 239 | 1298 | 1244 | 25.2 | 14.2 |

The preceding examples are offered to illustrate the aqueous developers of the present invention and their method of formulation and use, and they are not intended to limit the general scope of this invention in strict accordance therewith, but the invention is to be construed and limited only by the scope of the appended claims.

I claim:

1. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition.

2. The composition of claim 1, wherein said concentration of the active solvent is no more than 7 weight percentage points less or greater than said water solubility concentration of the active solvent, based on the weight of the total composition.

3. The composition of claim 1, wherein said concentration of the active solvent is no more than 3 weight percentage points less than and no more than 7 weight percentage points greater than said water solubility concentration of the active solvent, based on the weight of the total composition.

4. The composition of claim 1, wherein said concentration of the active solvent is between about 4 weight percent to about 50 weight percent of the total composition and said water is at a concentration of up to about 90 weight percent.

5. The composition of claim 1, wherein said cosolvent is a diluent for said active solvent, said cosolvent being more water soluble than said active solvent, and said cosolvent being within said composition at a concentration up to about 80 weight percent, based on the total weight of the composition.

6. The composition of claim 1, wherein said cosolvent is diacetone alcohol or 2-ethoxyethanol.

7. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, said composition further including a hydrophilic surfactant dissolved therein at a concentration up to about 5 weight percent, based on the total weight of the composition.

8. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, said composition further including an agent to adjust and buffer the pH of the composition to between about 4.5 and 5.5.

9. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, said composition further including a desensitizer selected from the group consisting of a hydrolyzed or alcoholized hydrophilic synthetic resin, a sulfite, a phosphate, and combinations thereof.

10. The composition of claim 9, wherein said desensitizer is a synthetic resin that is a polyacrylamide in which approximately 70 percent of acrylamide groups thereof have been hydrolyzed to acrylic acid groups.

11. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, wherein said single phase solution includes hydroxypropyl cellulose.

12. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, wherein said single phase solution includes glycerine as a humectant and water substitute.

13. A composition which is a developer or developer solution replenisher for photopolymeric lithographic plates, the developer composition being of the non-emulsion subtractive type that is a single-phase solution consisting of an active solvent in admixture with a water-miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, wherein said single phase solution includes additives that do not significantly alter overall properties of the composition, said additives being selected from the group consisting of colorants, corrosion inhibitors, and odor maskers.

14. A composition which is a developer or developer solution replenisher for photopolymeric lithographic plates, the developer composition being of the non-emulsion subtractive type that is a single-phase solution consisting of an active solvent in admixture with a water miscible cosolvent and water, said active solvent having a water solubility concentration at which it is partially water insoluble or only partially soluble within the total developer composition, said active solvent also being a good solvent for unexposed photopolymer of a lithographic plate, which photopolymer is insolubilized upon exposure to actinic radiation, said active solvent being ethylene glycol monobutyl ether acetate, said cosolvent being selected from the group consisting of water-miscible alcohols, glycols, glycol ethers, ketones and acetates, and said active solvent being dissolved within the total composition in admixture with said water-miscible cosolvent at an unexposed photopolymer swelling concentration at which said active solvent migrates out of the developer composition to swell the unexposed photopolymer of the exposed and imaged lithographic plate for subsequent removal thereof from the plate, said photopolymer swelling concentration of the active solvent being no more than 10 weight percentage points less or greater than said water solubility concentration of the active solvent, based on the weight of the total developer composition, said composition further including up to about 0.1 weight percent, based on the total weight of the composition, of a defoamer.

* * * * *